(12) United States Patent
Zhang et al.

(10) Patent No.: US 10,403,787 B2
(45) Date of Patent: Sep. 3, 2019

(54) OPTOELECTRONIC DEVICE COMPRISING THREE-DIMENSIONAL SEMICONDUCTOR STRUCTURES IN AN AXIAL CONFIGURATION

(71) Applicants: COMMISSARIAT A L'ENERGIE ATOMIQUE ET AUX ENERGIES ALTERNATIVES, Paris (FR); ALEDIA, Grenoble (FR)

(72) Inventors: Xin Zhang, Grenoble (FR); Bruno-Jules Daudin, La Tronche (FR); Bruno Gayral, Saint-Martin-le-Vinoux (FR); Philippe Gilet, Teche (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 0 days.

(21) Appl. No.: 15/779,388

(22) PCT Filed: Nov. 28, 2016

(86) PCT No.: PCT/FR2016/053122
§ 371 (c)(1),
(2) Date: May 25, 2018

(87) PCT Pub. No.: WO2017/093646
PCT Pub. Date: Jun. 8, 2017

(65) Prior Publication Data
US 2018/0351037 A1    Dec. 6, 2018

(30) Foreign Application Priority Data

Nov. 30, 2015 (FR) ...................... 15 61589

(51) Int. Cl.
*H01L 33/08* (2010.01)
*H01L 21/02* (2006.01)
(Continued)

(52) U.S. Cl.
CPC ........ *H01L 33/08* (2013.01); *H01L 21/02387* (2013.01); *H01L 21/02458* (2013.01);
(Continued)

(58) Field of Classification Search
CPC ..... H01L 33/0075; H01L 33/06; H01L 33/32; H01L 33/18; H01L 29/403;
(Continued)

(56) References Cited

U.S. PATENT DOCUMENTS

| | | |
|---|---|---|
| 2007/0248132 A1 | 10/2007 | Kikuchi et al. |
| 2016/0027961 A1 | 1/2016 | Mi et al. |
| 2016/0254138 A1 | 9/2016 | Kikuchi et al. |

FOREIGN PATENT DOCUMENTS

| | | |
|---|---|---|
| EP | 1 796 180 A1 | 6/2007 |
| EP | 2 665 100 A2 | 11/2013 |
| WO | WO 2014/138904 A1 | 9/2014 |

OTHER PUBLICATIONS

International Search Report dated Jan. 31, 2017 in PCT/FR2016/053122 citing references AA-AC, AO-AQ, and AX-AY therein, 3 pages.

(Continued)

*Primary Examiner* — Savitri Mulpuri
(74) *Attorney, Agent, or Firm* — Oblon, McCelland, Maier & Neustadt, L.L.P.

(57) ABSTRACT

The invention relates to an optoelectronic device (1) comprising at least one three-dimensional semiconductor structure (2) extending along a longitudinal axis (Δ) substantially orthogonal to a plane of a substrate (3) on which same lies, and comprising: a first doped portion (10), extending from
(Continued)

one surface of the substrate (3) along the longitudinal axis (Δ); an active portion (30) comprising a passivation layer (34) and at least one quantum well (32) covered laterally by said passivation layer (34), the quantum well (32) of the active portion (30) having a mean diameter greater than that of said first doped portion (10), said active portion (30) extending from the first doped portion (10) along the longitudinal axis (Δ); and a second doped portion (20), extending from the active portion (30) along the longitudinal axis (Δ). The invention is characterized in that the device comprises a plurality of three-dimensional semiconductor structures (2) extending substantially in parallel with one another, the active portions (30) of which are in mutual contact.

13 Claims, 3 Drawing Sheets

(51) Int. Cl.
  H01L 33/00 (2010.01)
  H01L 33/18 (2010.01)
  H01L 33/32 (2010.01)
  H01L 33/06 (2010.01)
(52) U.S. Cl.
  CPC .......... *H01L 33/0075* (2013.01); *H01L 33/18* (2013.01); *H01L 33/32* (2013.01); *H01L 33/06* (2013.01)
(58) Field of Classification Search
  CPC ......... H01L 21/02387; H01L 21/02603; H01L 21/02458
  See application file for complete search history.

(56) References Cited

OTHER PUBLICATIONS

Bavencove, A-L. et al. "Submicrometre resolved optical characterization of green nanowire-based light emitting diodes", Nanotechnology, vol. 22, No. 34, XP020208850, Jul. 28, 2011, pp. 1-9.

Daudin, B. et al. "Growth, structural and optical properties of GaN/AlN and GaN/GaInN nanowire heterostructures", Physics Procedia, vol. 28, XP028487914, 2012, pp. 5-16.

Bavencove, A.-L., et al., "GaN-based nanowires: From nanometric-scale characterization to light emitting diodes", Physica Status Solidi, Wiley-VCH Verlag GmbH & Co., 2010, pp. 1-3.

Bavencove, A.-L., et al., "Light emitting diodes based on GaN core/shell wires grown by MOVPE on n-type Si substrate", Electronic Letters, vol. 47 No. 13, Jun. 23, 2011, pp. 1-2 with cover page.

Bavencove, A.-L., et al., "Submicrometre resolved optical characterization of green nanowire-based light emitting diodes", Nanotechnology, vol. 22, 2011, p. 1-9 with cover page.

Li, Q., et al., "Optical performance of top-down fabricated InGaN/GaN nanorod light emitting diode arrays", Optics Express, vol. 19 No. 25, Dec. 5, 2011, 7 pages.

Tourbot, G., et al., "Structural and optical properties of InGaN/GaN nanowire heterostructures grown by PA-MBE", Nanotechnology vol. 22, 2011, pp. 1 8 with cover page.

Fernandez-Garrido, S., et al., "Self Regulated Radius of Spontaneously Formed GaN Nanowires in Molecular Beam Epitaxy", Nano Letters, vol. 13, 2013, pp. 3274-3280.

Tourbut, G., et al., "Growth mechanism and properties of InGaN insertions in GaN nanowires", Nanotechnology, vol. 23, 2012, pp. 1-6 with cover page.

OPTOELECTRONIC DEVICE COMPRISING THREE-DIMENSIONAL SEMICONDUCTOR STRUCTURES IN AN AXIAL CONFIGURATION

TECHNICAL FIELD

The field of the invention is that of optoelectronic devices comprising three-dimensional semiconductor structures, such as nanowires or microwires, suitable for emitting or detecting light.

PRIOR ART

Optoelectronic devices comprising three-dimensional semiconductor structures of the nanowire or microwire type exist, forming for example light-emitting diodes. Nanowires or microwires usually comprise a first doped portion, for example of n-type, and a second doped portion of the opposite type of conductivity, for example of p-type, between which there is an active portion comprising at least one quantum well.

They may be made in a so-called radial configuration, also called core/shell, in which the active portion and the second p-doped portion are formed at the periphery of the first n-doped portion. They may also be made in a so-called axial configuration, in which the active portion and the second p-doped portion do not cover the periphery of the first n-doped portion but extend essentially along a longitudinal axis of epitaxial growth.

Nanowires or microwires in an axial configuration have a smaller emission surface area than that of wires in a radial configuration, but have the advantage of being made of a semiconductor material with better crystal quality, thus offering a higher internal quantum efficiency, notably on account of better stress relaxation at the interfaces between the semiconductor portions. In the case of quantum wells made of InGaN, nanowires or microwires in an axial configuration thus make it possible to incorporate more indium, for emitting for example in the red or green.

As an example, the work by Bavencove et al., titled *Submicrometer resolved optical characterization of green nanowire-based light emitting diodes*, Nanotechnology 22 (2011) 345705, describes an example of an optoelectronic device with nanowires in an axial configuration, in which an upper part of the second p-doped portions is in mutual contact, and carries a polarization electrode that is transparent to the light emitted by the wires. Here, each active portion has an average diameter substantially identical to that of the first n-doped portion and comprises multiple quantum wells. The wires are made on the basis of GaN by molecular beam epitaxy.

However, there is a need to develop optoelectronic devices comprising three-dimensional semiconductor structures of the nanowire or microwire type having improved optical efficiency.

SUMMARY OF THE INVENTION

The invention has the aim of at least partly remedying the drawbacks of the prior art, and more particularly of proposing an optoelectronic device comprising at least one three-dimensional semiconductor structure with improved optical efficiency. For this purpose, the invention relates to an optoelectronic device comprising at least one three-dimensional semiconductor structure extending along a longitudinal axis substantially orthogonal to a plane of a substrate on which it lies, and comprising a first doped portion, extending from a face of the substrate along the longitudinal axis; an active portion comprising at least one quantum well, extending from the first doped portion along the longitudinal axis; and a second doped portion, extending from the active portion along the longitudinal axis.

According to the invention, the quantum well of the active portion has an average diameter greater than that of said first doped portion, and is covered laterally by a passivating layer.

Moreover, the optoelectronic device comprises a plurality of three-dimensional semiconductor structures extending substantially parallel to one another, with their active portions in mutual contact.

Some preferred but nonlimiting aspects of this optoelectronic device are as follows.

The quantum well or wells of each active portion are separated from the quantum well or wells of the adjacent active portion by the passivating layers in mutual contact.

The optoelectronic device may have a density of first doped portions per unit area of the substrate between $0.5 \times 10^{10}$ cm$^{-2}$ and $1.5 \times 10^{10}$ cm$^{-2}$, the first doped portions being separate from one another and having an average diameter that is substantially constant along the longitudinal axis.

The passivating layer may have an average thickness greater than or equal to 2 nm, and preferably between 2 nm and 15 nm.

The first doped portion may be made of a III-V compound, a II-VI compound, or a IV element or compound, and the passivating layer may be made of a compound comprising at least one element present in the compound of the first doped portion.

The average diameter of the quantum well or wells may be between 115% and 250% of the average diameter of the first doped portion.

The active portion may comprise a single quantum well extending continuously between the first and second doped portions, with said single quantum well being covered laterally by the passivating layer.

The active portion may comprise several layers forming quantum wells or quantum dots inserted between barrier layers, covered laterally by the passivating layer.

The three-dimensional semiconductor structure may be made of a material comprising predominantly a III-N compound, the passivating layer preferably being made of a compound selected from GaN, AlGaN and AlN.

The invention also relates to a method for making an optoelectronic device according to any one of the preceding features, in which the three-dimensional semiconductor structure or structures are formed by molecular beam epitaxy.

The method may comprise steps of formation of a plurality of three-dimensional semiconductor structures by epitaxial growth, in which:
i. the first doped portions are formed, which extend from a face of the substrate along the longitudinal axis;
ii. the active portions are formed, comprising at least one quantum well, which extend from the first doped portions along the longitudinal axis;
in step 11), the quantum well of each active portion is formed so as to have an average diameter greater than that of the first doped portion;
in addition, a passivating layer is formed, covering the quantum well laterally.

Formation of the passivating layer may be concomitant with formation of the quantum well.

The three-dimensional semiconductor structure may comprise predominantly a III-V compound, step 11) of formation of the active portion being carried out at a value $T_2$ of temperature of epitaxial growth lower than a value $T_1$ in step i) of formation of the first doped portion, and preferably between 600° C. and 680° C., and being carried out at a ratio of the atomic fluxes of the III elements to the V elements between 0.33 and 0.60. Thus, surprisingly, an optoelectronic device is obtained whose wire diodes have an emission spectrum with a reduced full width at half maximum of the emission peak. This is reflected in a broadening rate of the average diameter of the quantum well or wells, and therefore of the active portion, relative to that of the first doped portion, between 115% and 250%.

Step i) of formation of the first doped portion may comprise a substep of nucleation of the III-V compound carried out at a temperature of growth such that a density of first doped portions per unit area of the substrate is between $0.5 \times 10^{10}$ cm$^{-2}$ and $1.5 \times 10^{10}$ cm$^{-2}$.

BRIEF DESCRIPTION OF THE DRAWINGS

Other aspects, aims, advantages and features of the invention will become clearer on reading the following detailed description of preferred embodiments thereof, given as nonlimiting examples, and referring to the appended drawings, in which.

DETAILED PRESENTATION OF PARTICULAR EMBODIMENTS

In the figures and in the rest of the description, the same references represent elements that are identical or similar. Moreover, the various elements are not drawn to scale, for the sake of clarity of the figures. Furthermore, the terms "substantially", "approximately", and "about" are understood to mean "to within 10%".

The invention relates to an optoelectronic device comprising three-dimensional semiconductor structures suitable for forming light-emitting diodes or photodiodes.

The three-dimensional semiconductor structures have an elongated shape along a longitudinal axis Δ, i.e. whose longitudinal dimension along the longitudinal axis Δ is greater than the transverse dimensions. The three-dimensional structures are then called "wires", "nanowires" or "microwires". The transverse dimensions of the wires, i.e. their dimensions in a plane orthogonal to the longitudinal axis Δ, may be between 5 nm and 5 μm, for example between 10 nm and 500 nm, and preferably between 30 nm and 300 nm. The height of the wires, i.e. their longitudinal dimension along the longitudinal axis Δ, is greater than the transverse dimensions, for example 2 times, 5 times and preferably at least 10 times greater.

The cross section of the wires, in a plane orthogonal to the longitudinal axis Δ, may have various shapes, for example a circular, oval, polygonal for example triangular, square, rectangular or even hexagonal shape. Here, the diameter is defined as being a quantity associated with the perimeter of the wire at the level of a cross section. It may be the diameter of a disk having the same area as the cross section of the wire. The local diameter is the diameter of the wire at a given height of the latter along the longitudinal axis Δ. The average diameter is the mean value, for example arithmetic mean, of the local diameters along the wire or a portion thereof.

Figure 1:
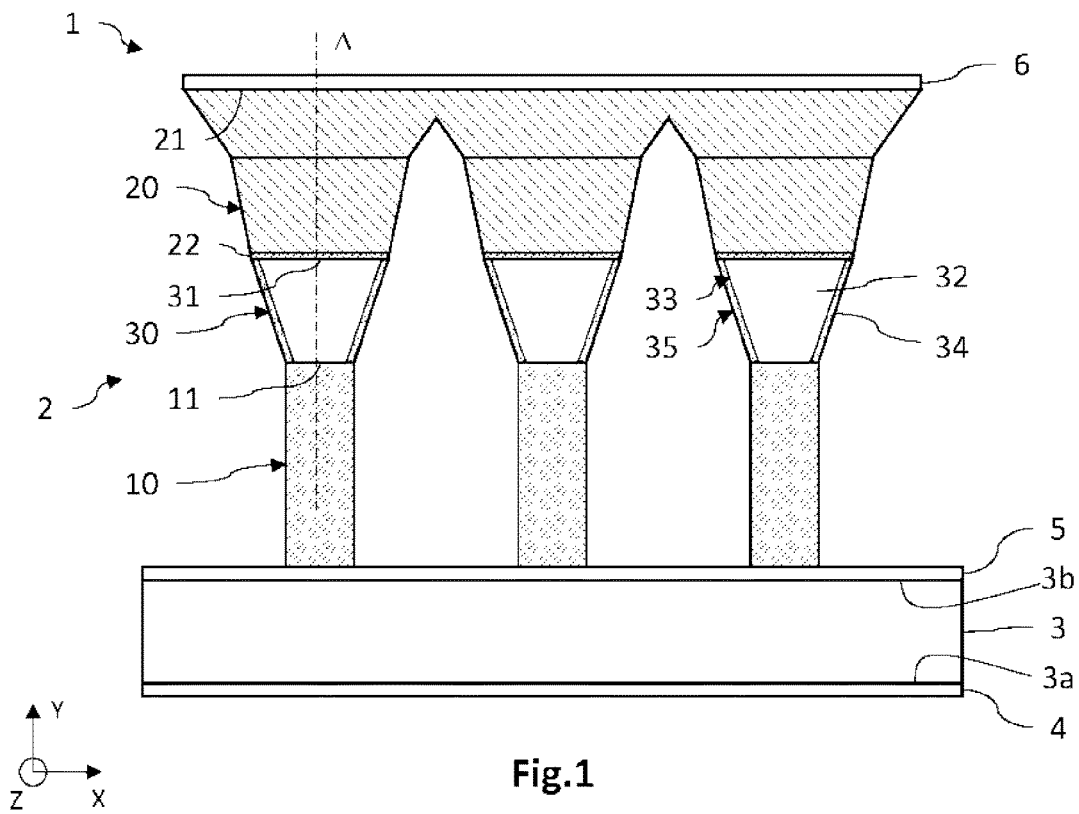
FIG. 1 is a schematic sectional view of an optoelectronic device according to a first embodiment, comprising three-dimensional semiconductor structures in an axial configuration, whose active portion is broadened and passivated.

FIG. 1 illustrates schematically a partial sectional view of a first embodiment of an optoelectronic device 1 comprising three-dimensional semiconductor structures 2 forming axial wire light-emitting diodes.

Here, and for the rest of the description, an orthonormal three-dimensional coordinate system (X,Y,Z) is defined, where the (X,Y) plane is substantially parallel to the plane of a substrate of the optoelectronic device, the Z axis being oriented in a direction orthogonal to the plane of the substrate.

In this example, the optoelectronic device 1 comprises:
a substrate 3, for example made of a semiconductor material, having two faces, called the rear face 3a and the front face 3b, opposite one another;
a first polarization electrode 4, here in contact with the rear face 3a of the substrate;
a nucleation layer 5, made of a material suitable for epitaxial growth of three-dimensional semiconductor structures, covering the front face 3b of the substrate;
three-dimensional semiconductor structures 2, here in the form of wires, which extend from the nucleation layer 5 along a longitudinal axis Δ oriented substantially orthogonally to the (X,Y) plane of the front face 3b of the substrate 3, each wire 2 comprising a first doped portion 10 in contact with the nucleation layer 5, an active portion 30 and a second doped portion 20 arranged in the prolongation of the first doped portion 10 along the longitudinal axis Δ;
a layer of second polarization electrode 6, in contact with each second doped portion 20.

Here, each three-dimensional semiconductor structure 2 forms a wire light-emitting diode in an axial configuration, suitable for emitting light at the level of its active portion. The wires 2 are said to be in an axial configuration to the extent that each active portion 30 essentially covers an upper face 11 of the first doped portion 10 substantially orthogonal to the longitudinal axis Δ, and extends along the longitudinal axis Δ. Moreover, the second doped portion 20 essentially covers an upper face 31 of the active portion 30 substantially orthogonal to the longitudinal axis Δ, and extends along the longitudinal axis Δ. The wires 2 therefore have an axial configuration, which is thus different than the aforementioned core/shell configuration.

Each wire 2 is made starting from at least one semiconductor material, which may be selected from the III-V compounds comprising at least one element from column III and at least one element from column V of the periodic table; the II-VI compounds comprising at least one element from column II and at least one element from column VI; or the IV elements or compounds comprising at least one element from column IV. As an example, III-V compounds may be III-N compounds, such as GaN, InGaN, AlGaN, AlN, InN or AlInGaN, or even compounds comprising an element from column V of the arsenic or phosphorus type, for example AsGa or InP. Moreover, II-VI compounds may be CdTe, HgTe, CdHgTe, ZnO, ZnMgO, CdZnO or CdZnMgO. Finally, IV elements or compounds may be used, such as Si, C, Ge, SiC, SiGe, or GeC. The semiconductor material of the three-dimensional structure may comprise a dopant, for example silicon providing doping of the n-type of a III-N compound, or magnesium providing doping of the p-type.

The active portion 30 is the portion at the level of which most of the light is emitted from the wire. It comprises at least one quantum well, made of a second material having a bandgap energy less than that of the first doped portion and of the second doped portion, corresponding to an emission zone of the active portion. The quantum well may be thick or may be formed from at least one thin layer preferably arranged between two barrier layers, thus improving the confinement of the charge carriers. The second material comprises the III-V, II-VI or IV compound of the first and second doped portions in which at least one additional element is incorporated. As an example, in the case of a wire made on the basis of GaN, the second material forming the quantum well is preferably InGaN. The atomic percentage of the additional element is a function of the required optical properties and of the emission spectrum of the wire. As described in detail later, the active portion may be formed from a single quantum well in a portion of a semiconductor material extending between the first and second doped portions. Alternatively, it may comprise several quantum wells in the form of layers or dots inserted between barrier layers.

According to a preferred embodiment, each wire 2 is made on the basis of GaN, the quantum well or wells being made of InGaN. The first doped portion 10 may be formed from GaN, and may be doped with the first type of conductivity, for example of the n-type, notably with silicon. The height of the first doped portion may be between 100 nm and 10 μm, for example between 500 nm and 5 μm, and notably may be substantially equal to 1 μm.

The active portion 30 may comprise one or more quantum wells, for example made of InGaN. The active portion may comprise a single quantum well that extends continuously along the longitudinal axis Δ between the first and second doped portions 10, 20. Alternatively, it may comprise multiple quantum wells and is then formed from an alternation, along the longitudinal axis Δ, of quantum wells made for example of InGaN, and barrier layers made for example of GaN. The height of the active portion may be between 20 nm and 500 nm, for example between 50 nm and 200 nm, and notably may be substantially equal to 100 nm.

The second doped portion 20 may be formed from GaN, and may be doped with the second type of conductivity opposite to the first, for example of the p-type, notably with magnesium. The height of the second doped portion may be between 50 nm and 5 μm, for example between 100 nm and 1 μm and notably may be of the order of some tens or hundreds of nanometers so as to limit the series resistance associated with this doped portion. The height may thus be substantially equal to 400 nm.

The second doped portion 20 may comprise an electron blocking layer 22 located at the interface with the active portion 30. The electron blocking layer may be formed from a ternary III-N compound, for example AlGaN or AlInN, advantageously p-doped. It makes it possible to increase the level of radiative recombinations within the active portion.

The second polarization electrode 6 is in contact with an upper face 21 of the doped portion 20 and is suitable for providing injection of charge carriers into the wires 2. It is made of a material that is substantially transparent with respect to the light emitted by the wire, for example indium tin oxide (ITO). It has a thickness from a few nanometers to some tens or hundreds of nanometers.

Moreover, each wire 2 rests on a substrate 3 whose upper face 3b may be covered with the nucleation layer 5. The nucleation layer 5 is made of a material promoting nucleation and growth of the wires, for example aluminum nitride (AlN) or aluminum oxide ($Al_2O_3$), magnesium nitride ($Mg_xN_y$), nitride or carbide of a transition metal or any other suitable material. The thickness of the nucleation layer may be of the order of a few nanometers or some tens of nanometers. In this example, the nucleation layer is made of AlN.

The substrate 3 may be a monobloc structure or may be formed from a stack of layers such as a substrate of the SOI type (acronym of Silicon On Insulator). The substrate may be made of a semiconductor material, for example silicon, germanium, silicon carbide, or a III-V or II-VI compound. It may also be made of a metallic material or of an insulating material. It may comprise a layer of graphene, of molybdenum sulfide or selenide ($MoS_2$, $MoSe_2$), or of any other equivalent material. In this example, the substrate is of highly doped n-type single-crystal silicon.

The first polarization electrode 4 is in contact with the substrate 3, electrically conductive here, for example at the level of its rear face 3a. It may be made of aluminum or of any other suitable material.

Thus, when a potential difference is applied to the wires 2 in a forward direction via the two polarization electrodes, the wires 2 emit light whose emission spectrum has an intensity peak at a wavelength depending mainly on the composition of the quantum well or wells.

As illustrated in FIG. 1, the active portion 30 comprises at least one quantum well 32 whose average diameter is greater than the average diameter of the first doped portion 10. Here, the first doped portion 10 has an average diameter substantially equal to the local diameter. The average diameter of the first doped portion 10 may be between 5 nm and 5 μm, for example between 10 nm and 100 nm, and notably may be substantially equal to 50 nm. In the case of a single quantum well, the average diameter is the mean value of the local diameters of this same quantum well along the longitudinal axis Δ. In the case of multiple quantum wells that are in the form of layers or dots, the local diameter is the diameter of a quantum well layer or the cumulative diameter of the quantum dots located at the level of one and the same cross section. The average diameter is the mean value of the local diameters of the different quantum layers or dots.

The active portion 30 then comprises a local diameter greater than the average diameter of the first doped portion 10. In the example in FIG. 1, it also has an average diameter that increases with increasing distance from the first doped portion 10, starting from a first value substantially equal to the local diameter of the first doped portion 10 at the level of its upper face 11, to a second maximum value at the interface between the active portion 30 and the second doped portion 20. The active portion 30 then has an average diameter greater than that of the first doped portion 10.

This is reflected in broadening of each wire 2 in the (X,Y) plane at the level of the active portion 30. The average diameter of the active portion 30 may be between 110% and 400% of the average diameter of the first doped portion 10, and preferably between 115% and 250% so as to give a better crystal quality and/or an emission spectrum whose full width at half maximum (FWHM) of the emission peak is reduced. As an example, for an average diameter of the first doped portion 10 of about 50 nm, the average diameter of the active portion 30 may be equal to about 75 nm.

The second doped portion 20 extends from the active portion 20 along the longitudinal axis Δ of the wire 2. In this example, the local diameter of the second doped portion 20 gradually increases, until it comes into contact with the second doped portion 20 of the adjacent wires 2 and thus causes coalescence of the wires 2 at the level of the second doped portions 20. Thus, the local diameter increases from a value substantially equal to the local diameter of the active portion 30 at the level of its upper face 31 to a value corresponding for example to contact with the adjacent second doped portions 20. As an example, for an average diameter of about 50 nm for the first doped portion 10 and about 75 nm for the active portion 30, the average diameter of the second doped portion 20 may be equal to about 100 nm. Alternatively, the local diameter of the second doped portion 20 may be substantially constant along the longitudinal axis Δ and may thus be substantially equal to the value of the local diameter of the active portion 30 at the level of its upper face 31.

Moreover, the active portion 30 comprises a passivating layer 34, also called passivating shell, located at the level of its side wall 35. The passivating layer 34 covers the lateral edge 33 of the quantum well or wells 32, preferably continuously along their circumference. The lateral edge 33 of the quantum well 32 is the surface of the quantum well, in a transverse plane (X,Y), located opposite the side wall 35 of the active portion 30. The passivating layer 34 has a thickness that depends on the dielectric constant or bandgap energy of the material forming the passivating layer, in such a way that the passivating layer makes it possible to limit the effect of possible surface states connected for example with broadening of the active portion, and these surface states may lead to nonradiative recombinations in the quantum well or wells. The thin passivating layer may thus have a thickness between 2 nm and 15 nm, for example between 5 nm and 10 nm.

The passivating layer 34 may thus be made of a material selected from the III-V compounds, the II-VI compounds, the IV compounds or elements, or even dielectric materials such as nitrides and oxides of aluminum ($Al_2O_3$) or of silicon ($SiO_2$, $Si_3N_4$). As an example, in the case of first and second doped portions made of GaN and a quantum well made of InGaN, the passivating layer may be made of GaN, AlN or AlGaN, for example not intentionally doped.

Preferably, the thickness and the material of the passivating layer 34 are selected so that the passivating layer has an electrical resistance or a bandgap energy greater than that of the quantum wells, so as to optimize transport of the charge carriers toward the quantum well or wells. As an example, the passivating layer may be formed from AlN, AlGaN or even GaN with a thickness between 2 nm and 15 nm.

When the material forming the first and second doped portions 10, 20 is a III-V compound or a II-VI compound, the material forming the passivating layer 34 is also a III-V compound or a II-VI compound respectively, and may comprise the same element from column V or VI as the material of the first and second doped portions. As an example, in the case of first and second doped portions made of GaN and a quantum well made of InGaN, the passivating layer may be made of GaN, AlN, or AlGaN.

As will be presented in detail later, the passivating layer 34 is advantageously formed concomitantly with formation of the quantum well or wells 32. It will thus limit the surface states in the lateral edge of the quantum well or wells, which helps to increase the internal quantum efficiency of the active portion.

Thus, the wires of the optoelectronic device each have an improved optical efficiency owing to the combined effect of the broadening and passivation of the active portion. Here, the optical efficiency corresponds to the ratio of the luminous flux emitted by the optoelectronic device to the electric power absorbed by the device.

In fact, broadening of the active portion leads to an increased emission area per wire and therefore to a larger luminous flux emitted. Moreover, passivation of the lateral edge of the quantum well or wells of the active portion makes it possible to increase the internal quantum efficiency of the active portion by limiting the impact of the surface states at the lateral edge of the quantum wells. In fact, the surface states, resulting for example from structural defects or dangling bonds that may notably appear during broadening of the active portion, may be the cause of nonradiative recombinations in the active portion. Thus, passivation of the active portion reduces the level of nonradiative recombinations in the active portion and thus increases the internal quantum efficiency of the active portion of the wire.

Broadening of the active portion and passivation of the side wall of the latter therefore lead to an increase in the optical efficiency of each wire.

Figure 2:
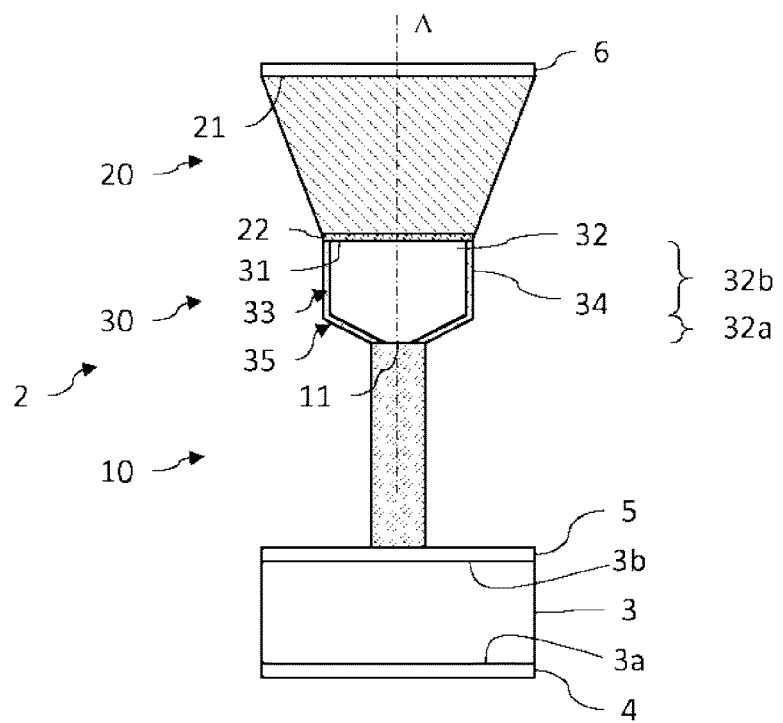
FIG. 2 is a schematic sectional view of another example of a three-dimensional semiconductor structure in an axial configuration, whose active portion comprises a single quantum well.

FIG. 2 is a partial schematic view of a three-dimensional semiconductor structure 2 of an optoelectronic device according to a first variant, the three-dimensional semiconductor structure 2 forming a light-emitting diode in the form of a wire in an axial configuration whose active portion 30 comprises a single quantum well 32. In this example, the wire 2 is made on the basis of GaN and the quantum well is made of InGaN.

The active portion 30 comprises a single quantum well 32 made of a second semiconductor material, here InGaN, comprising the same compound GaN as that of the first and second doped portions 10, 20, in which an additional element is incorporated, here indium. The atomic proportion of the elements of the compound forming the second material is preferably substantially uniform within the quantum well. The single quantum well 32 of InGaN forms a portion that extends between the first and second doped portions 10, 20 and has an average diameter greater than the average diameter of the first doped portion 10. As illustrated in FIG. 2, it may be formed of two parts called lower part 32a and upper part 32b, arranged on one another along the longitudinal axis Δ, the lower part 32a being located between the first doped portion 10 and the upper part 32b, and having a local diameter that increases continuously starting from the value of the local diameter of the first doped portion 10 at the level of the upper face 11. The second part 32b has a local diameter that is substantially constant over its entire height.

Moreover, the active portion 30 comprises a passivating layer 34 at the level of its side wall 35, which covers the lateral edge 33 of the quantum well 32 made of InGaN, both at the level of the first part 32a and of the second part 32b. It is made of a material identical to the compound GaN of the first and second doped portions, here not intentionally doped. Alternatively, it may be formed of AlN or AlGaN, thus making it possible to increase the electrical resistance or the bandgap energy of the passivating layer. Here, the passivating layer has a thickness between 2 nm and 15 nm, for example 5 nm.

An example of a method for making the optoelectronic device is now described, in the case when the three-dimensional semiconductor structures are identical or similar to that described with reference to FIG. 2, in which the active portion 30 is formed from a single quantum well 32. In this example, the wires 2 are produced by molecular beam epitaxy (MBE) and are made on the basis of GaN.

In the context of molecular beam epitaxy, the parameters having an influence on epitaxial growth are:

the nominal III/V ratio, defined as the ratio of the flux of elements from column III to the flux of elements from column V, i.e. in this case the Ga/N ratio during growth of the first and second doped portions of GaN; and the III/N ratio, also called Metal/N or (Ga+In)/N, during growth of the quantum well of InGaN;

the nominal In/III ratio, defined as the ratio of the flux of the additional element, here indium, to the flux of the elements from column III, i.e. gallium and indium;

the temperature of growth T, measured here at the level of the substrate.

In a first step, the first doped portion 10 is formed by epitaxial growth starting from the surface of the nucleation layer 5. For this, the temperature of growth is raised to a first value $T_1$, for example between 775° C. and 850° C., for example 845° C. The nominal III/V ratio, here the ratio Ga/N, has a value $(III/V)_1$ below 1 in order to be in so-called nitrogen rich conditions. It may be for example between 0.1 and 0.5. The GaN material of the first portion is n-doped with silicon. Here, the first n-doped portion has a height of about 1 μm and an average diameter $D_N$ of about 50 nm. Thus, a first doped portion is obtained that has the shape of a wire that extends along the longitudinal axis Δ. It has an upper face, opposite the substrate and oriented along the crystallographic axis c, substantially flat.

In a second step, the active portion 30 is formed by epitaxial growth starting from the upper face 11 of the first n-doped portion 10. For this, the temperature of growth is raised to a second value $T_2$ lower than the first value $T_1$, and within a temperature range allowing incorporation of indium. In the case of InGaN, the range of incorporation of indium is typically between 560° C. and 690° C. As an example, the value $T_2$ of the temperature is in this case between 600° C. and 680° C., for example equal to about 670° C. Moreover, the nominal In/III ratio has a value $(In/III)_2$ between 5% and 70%, preferably between 10% and 50%, depending on the required InGaN composition, for example here 28% with the aim of obtaining emission of light in the green at about 555 nm.

Moreover, the nominal III/N ratio has a value $(III/N)_2$ greater than that $(III/V)_1$ of the preceding step owing to the flux of indium. While the nominal Ga/N ratio remains constant at 0.3, the value $(III/N)_2$ is then above 0.3. It may be between 0.32 and 1.5, and preferably may be between 0.33 and 0.60 so as to give better crystal quality and/or an emission spectrum whose full width at half maximum (FWHM) of the emission peak is reduced. For example, here it is 0.42. Thus, an active portion is obtained comprising a single quantum well of InGaN with an atomic proportion of indium of about 28%, not intentionally doped, able to emit light at around 550 nm when the wire is forward-polarized.

Figure 3:
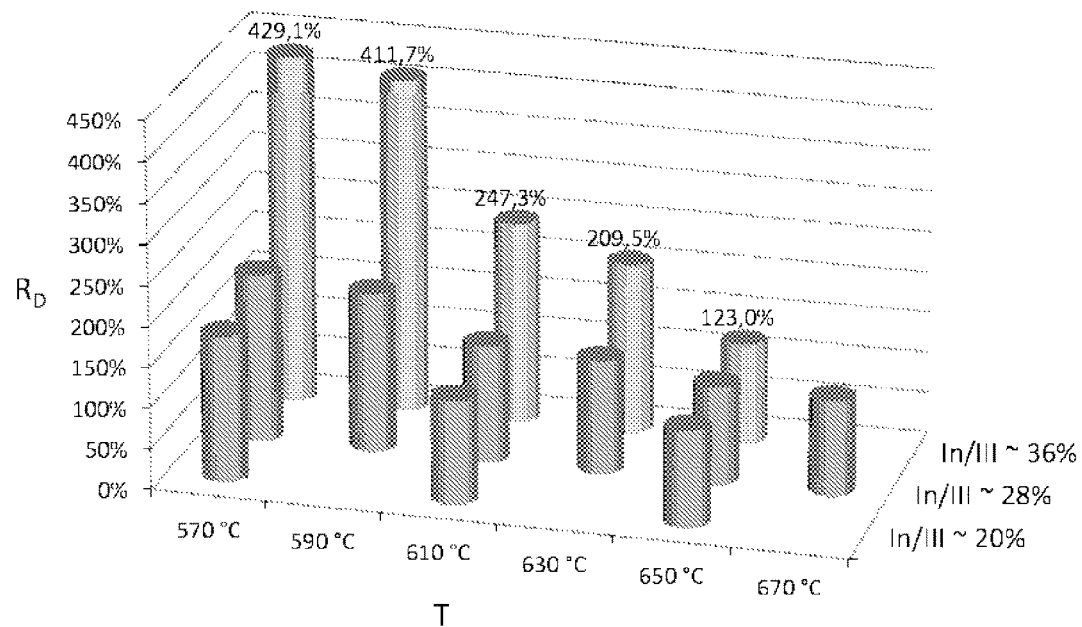
FIG. 3 is a diagram showing an example of the variation of the broadening rate $R_D$ of the active portion as a function of the temperature of growth T and of the nominal In/III ratio.

The inventors have demonstrated that lowering the temperature of growth, for example to a temperature between 600° C. and 680° C., combined with the increase in the nominal III/N ratio, for example between 0.33 and 0.60, leads to broadening of the average diameter of the quantum well, and therefore of the active portion, relative to that of the first n-doped portion, for example broadening of between 115% and 250%. As shown by the diagram in FIG. 3, the broadening rate $R_D=D_{PA}/D_N$, where $D_{PA}$ is the average diameter of the active portion and $D_N$ that of the first doped portion, depends on the decrease in the temperature of growth and the increase in the nominal III/N ratio. Thus, at a temperature of growth below the value $T_1$, increasing the nominal In/III ratio, and therefore the nominal III/N ratio, leads to an increase in the broadening rate $R_D$. Moreover, at nominal III/N ratio greater than the value $(III/N)_1$, lowering the temperature of growth leads to an increase in the broadening rate $R_D$. Thus, depending on the required emission spectrum, which imposes a value of the nominal III/N ratio, increasing the nominal III/N ratio and/or lowering the temperature of growth make it possible to obtain a broadening rate $R_D$ of the active portion leading to an increase in the optical efficiency of the wire. It can also be seen that for a temperature of growth $T_2$ between 600° C. and 680° C. and a ratio $(III/N)_2$ between 0.33 and 0.60, a diode is obtained that is able to emit light whose emission spectrum has, at the emission peak, a reduced full width at half maximum.

Figure 4:
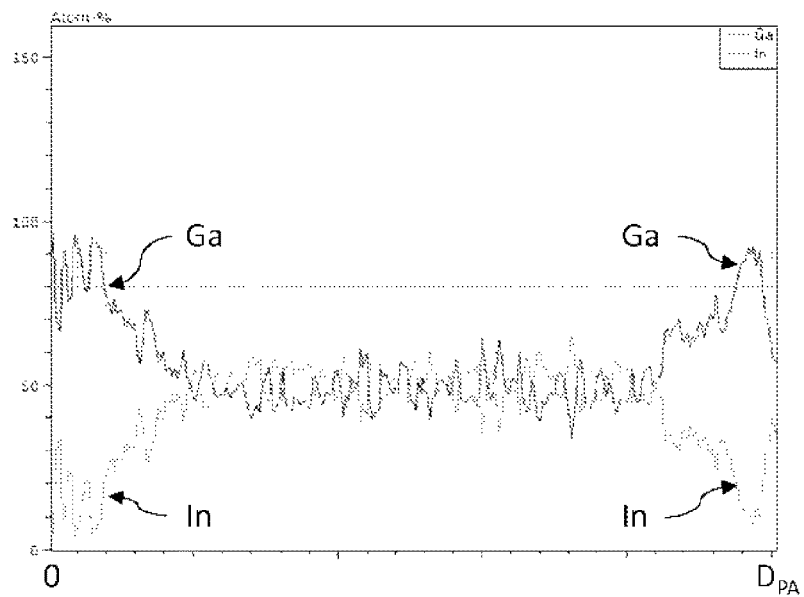
FIG. 4 illustrates an example of the variation of the atomic proportion of indium and gallium over a cross section of the active portion of the three-dimensional semiconductor structure shown in FIG. 2, based on energy dispersive X-ray spectrometry (EDX)

Moreover, the inventors have demonstrated that the epitaxial growth of the active portion 30 comprising a single quantum well 32 may be accompanied by simultaneous formation of the passivating layer 34 surrounding the lateral edge 33 of the quantum well. Thus, the active portion is formed from a single quantum well of InGaN whose lateral edge is passivated by a passivating layer of GaN. As shown in FIG. 4, which corresponds to the atomic proportion of indium and gallium over a transverse profile of the active portion obtained by energy dispersive X-ray spectrometry (EDX), a passivating layer of GaN with an average thickness of about 5 nm is located at the level of the lateral edge of the quantum well of InGaN. The concomitant formation of the single quantum well and of the passivating layer makes it possible to increase the internal quantum efficiency of the active portion provided the surface states associated with the dangling bonds of the quantum well, potentially leading to nonradiative recombinations, are passivated by the passivating layer.

A broadened active portion 30 is then obtained, in which the lateral edge 33 of the quantum well 32 is passivated, which makes it possible to increase the optical efficiency of the wire. The active portion may have a height from 75 nm to 100 nm and an average diameter from 75 nm to 100 nm. The passivating layer may have an average thickness of the order of 2 nm to about 10 nm.

In a third step, the second doped portion 20 is formed by epitaxial growth starting from the upper face 31 of the active portion 30. For this, the flux of indium is stopped and then the value of the nominal III/N ratio, here the ratio Ga/N, is increased to a value $(III/N)_3$ greater than that $(III/N)_2$ of the second step, and preferably above 1, for example equal to about 4/3. Moreover, the temperature of growth has a value $T_3$ which may be equal to, less than or greater than the second value $T_2$, but which remains lower than the first value $T_1$, for example equal to about 670° C. This is reflected in broadening of the second p-doped portion. The latter may have a height of about 350 nm and an average diameter of about 150 nm. The growth of the second p-doped portion may continue until there is mutual contact and coalescence between the second p-doped portions, thus forming a substantially flat upper surface. Thus, a wire is obtained in an axial configuration with a broadened active portion whose single quantum well has a passivated lateral edge. Several wires may be obtained in this way, here in mutual contact at the level of their respective p-doped portion.

Finally, in a last step, the second polarization electrode 6, made of a material that is electrically conductive and transparent to the light emitted by the wires, is deposited on the upper face 21 so as to be in contact with the second doped portions 20. Thus, application of a forward potential difference to the wires by the two polarization electrodes leads to emission of light for which the properties of the emission spectrum depend on the composition of the quantum well in the active portions. The optical efficiency is increased relative to that of the aforementioned examples of the prior art in that, at equivalent density of wires, the wires according to the invention have a broadened active portion whose quantum well has a passivated lateral edge.

Figure 5:
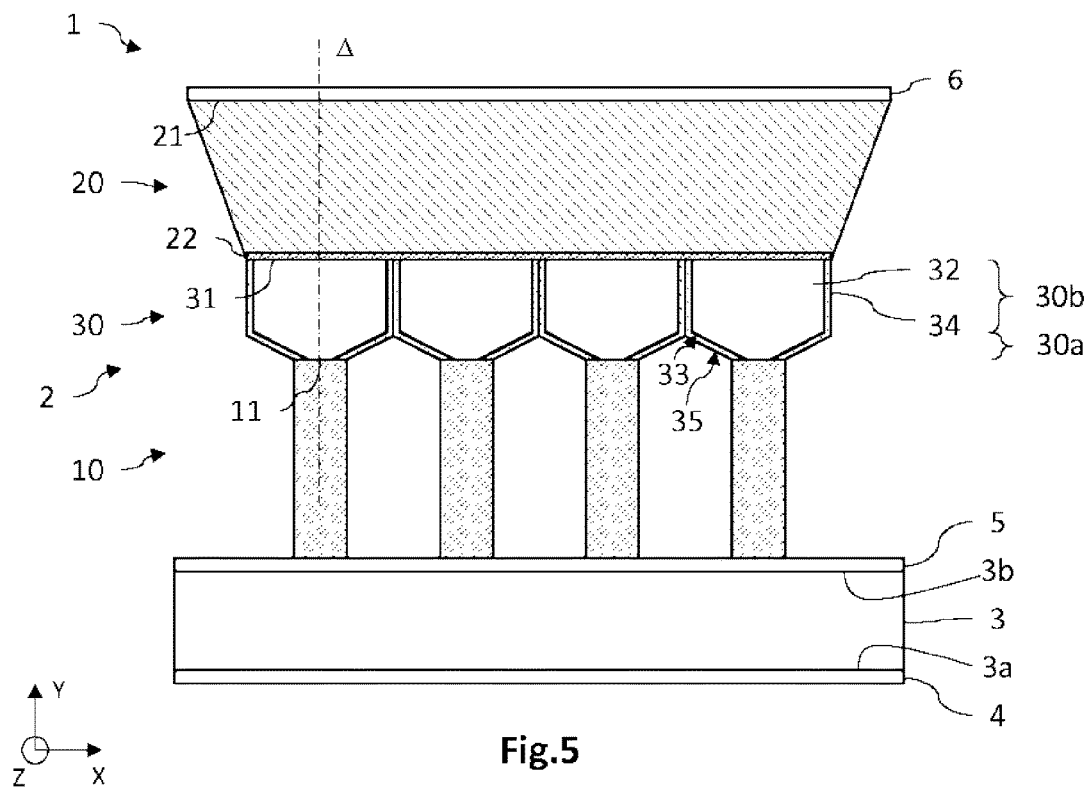
FIG. 5 is a schematic sectional view of an optoelectronic device according to a second embodiment, comprising three-dimensional semiconductor structures in an axial configuration, whose active portions are in mutual contact.

FIG. 5 is a schematic sectional view of an optoelectronic device 1 according to a second embodiment, which differs from those shown in FIGS. 1 and 2 essentially in that the wires 2 are in mutual contact at the level of the active portions 30.

In an identical manner to the embodiment in FIG. 1, the optoelectronic device 1 comprises a substrate 3 of a semiconductor material, for example of highly n-doped silicon, covered on its front face 3b with a nucleation layer 5, and whose opposite face 3a is covered with a layer forming the first polarization electrode 4.

The three-dimensional semiconductor structures are here identical or similar to that described with reference to FIG. 2. They are in the form of wires in an axial configuration that extend from the nucleation layer along the longitudinal axis Δ oriented substantially orthogonally to the (X,Y) plane of the front of the substrate, each wire 2 comprising a first doped portion 10 in contact with the nucleation layer 5, an active portion 30 and a second doped portion 20 arranged in the prolongation of the first doped portion 10 along the longitudinal axis Δ.

Here, the active portion 30 comprises a single quantum well 32 with an average diameter greater than that of the first doped portion 10, the lateral edge 33 of which is covered with a passivating layer 34. In this example, the active portion 30 comprises a single quantum well of InGaN as well as a passivating layer of GaN.

The wires 2 are in mutual contact at the level of the active portions 30, so that each active portion is in contact with one or more adjacent active portions. It is also called coalescence of the wires at the level of the active portions. More precisely, the active portions 30 are in mutual contact at the level of the passivating layers 34, the quantum well 32 of each active portion then being separated from the quantum well 32 of the adjacent active portion by the passivating layers 34 in mutual contact. The first doped portions 10 are not in mutual contact and are separate from one another.

Here, each active portion 30 comprises a first part 30a that extends from the first doped portion 10 along the longitudinal axis Δ, in which the local diameter of the quantum well 32 increases until the passivating layer 34 covering the lateral edge 33 of the quantum well meets the passivating layer 34 of the active portion of the adjacent wire 2. A second part 30b then extends from the first part 30a, in which the quantum well 32 has a substantially constant local diameter along the longitudinal axis Δ, the latter being separated from the adjacent quantum well 32 by the passivating layers 34 in mutual contact, along the longitudinal axis Δ.

The optoelectronic device also comprises second doped portions 20 in mutual contact starting from the upper face 31 of the active portions. The second doped portions 20 thus differ from those described with reference to FIG. 1 in that they form a p-doped layer that covers all of the active portions 30 continuously. Here, it has a substantially uniform thickness along the lateral dimensions of the optoelectronic device in the (X,Y) plane. Here, the p-doped layer comprises an electron blocking layer 22 located at the interface with the active portions 30. The upper face 21 of the p-doped layer is covered with the polarization electrode 6.

Thus, coalescence of the wires 2 at the level of the active portions 30, and no longer solely at the level of the second doped portions 20, leads to optimization of the emission area of the optoelectronic device per unit area of the substrate. Moreover, as the quantum well or wells 32 of each active portion 30 are separated from the quantum well or wells 32 of the adjacent active portion 30 by the passivating layers 34 in mutual contact, the nonradiative recombinations are thus limited at the level of the grain boundary formed by the coalescence of the passivating layers, thus increasing the internal quantum efficiency of each wire. The optical efficiency of the optoelectronic device is then optimized.

An example of a method for making the optoelectronic device according to the embodiment illustrated in FIG. 5 is now described. In this example, the wires 2 are made by molecular beam epitaxy (MBE) and are based on GaN. Each active portion 30 comprises a single quantum well 32 of InGaN and the passivating layers 34 are in this case made of GaN. As mentioned above, the passivating layers may in this case be made of other III-N materials, such as AlN or AlGaN.

Coalescence of the active portions 30 of the wires is obtained by adjusting the density of the first doped portions 10 per unit area of the substrate, or surface density, as well as by adjusting the broadening rate $R_D$ of the active portions 30.

The first step of formation of the first doped portions 10 by epitaxial growth is similar to that described above, except that, firstly, the temperature of growth and the nominal III/V ratio, here Ga/N, are adjusted to obtain a sufficient surface density of first doped portions. As an example, an initial value $T_1$ of temperature of growth equal to 840° C. to within 5%, combined with an initial value $(III/V)_1$ of 0.5 of the nominal Ga/N ratio leads to a surface density of first doped portions between $0.5 \times 10^{10}$ cm$^{-2}$ and $1.5 \times 10^{10}$ cm$^{-2}$, for example substantially equal to $1.0 \times 10^{10}$ cm$^{-2}$. This surface density of the first doped portions then makes it possible to obtain first active portions with good crystal quality, sufficiently spaced apart, while then allowing coalescence of the active portions. Secondly, the $(III/V)_1$ value of the nominal Ga/N ratio may be maintained or lowered to a value of the order of 0.3, and the value $T_1$ of the temperature of growth may be maintained. Epitaxial growth of the first doped portions along the longitudinal axis Δ is then performed.

The second step of formation of the active portions 30 by epitaxial growth is similar to that described above, except that the temperature of growth and the III/V ratio, here Metal/N, are adjusted to obtain a broadening rate $R_D$ sufficient to ensure coalescence of the active portions. As an example, a broadening rate greater than or equal to 115%, and for example between 115% and 250% makes it possible to obtain coalescence of the active portions, notably when the surface density of the first doped portions is between $0.5 \times 10^{10}$ cm$^{-2}$ and $1.5 \times 10^{10}$ cm$^{-2}$. Thus, a value $T_2$ of the temperature of growth between 600° C. and 680° C. combined with a value (III/V)$_2$ of the Metal/N ratio between 0.33 and 0.60 ensures coalescence of active portions with good crystal quality while optimizing the uniformity of the atomic proportion of indium incorporated within each active portion. Thus, active portions 30 in mutual contact are obtained, in which each single quantum well 32 of InGaN is separated from the quantum well 32 of the adjacent active portion 30 by the passivating layers 34 in mutual contact. The upper faces 31 of the active portions 30 thus form a substantially flat surface on which a doped layer 20 may be deposited.

The third step of formation of the second doped portions 20 by epitaxial growth is identical or similar to that described above. The flux of indium is stopped, and then the value of the nominal III/N ratio, here once again Ga/N, is increased to a value (III/N)$_3$ greater than or equal to that (III/N)$_2$ of the second step, and preferably above 1, for example equal to about 4/3. Moreover, the temperature of growth $T_3$ may be equal to, less than or greater than the second value $T_2$, but in this case remains less than the first value $T_1$, for example equal to about 670° C. Thus, a p-doped layer is obtained that covers the active portions of the wires continuously and has a substantially constant thickness.

Finally, a polarization electrode layer 6 is deposited on the upper face 21 of the doped layer 20. Application of a forward potential difference to the wires via the polarization electrodes leads to emission of light by the wires, whose optical efficiency is optimized.

Figure 6A:
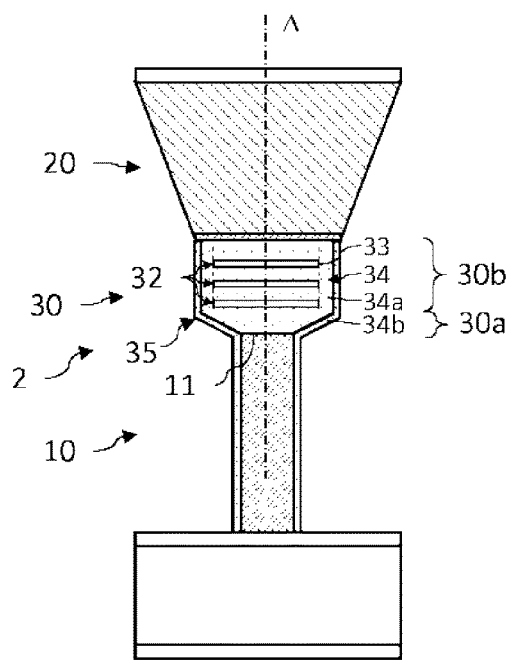
FIG. 6a is a schematic sectional view of a variant of three-dimensional semiconductor structure in an axial configuration, whose active portion comprises multiple quantum wells in the form of layers.

FIG. 6a is a schematic partial view of a section of a three-dimensional semiconductor structure of an optoelectronic device in an axial wire configuration. The three-dimensional semiconductor structure is similar to that described with reference to FIG. 2 and differs from it essentially in that the active portion 30 comprises multiple quantum wells 32 in the form of an alternation of layers forming the quantum wells, and barrier layers.

In this example, the wire 2 comprises a first doped portion 10, on which an active portion 30 comprising three layers 32 of quantum wells inserted between barrier layers extends along the longitudinal axis Δ. A second doped portion 20 extends along the longitudinal axis Δ on the active portion 30. Here, the wire 2 is obtained by molecular beam epitaxy and is based on GaN, the layers forming the quantum wells in this case being of InGaN.

Here, the active portion 30 comprises a first part 30a of barrier layer of GaN that extends from the first doped portion 10 along the longitudinal axis Δ, in which the local diameter of the quantum well increases from a first value substantially equal to that of the local diameter of the first doped portion 10 at the level of its upper face 11, up to a second value. A second part 30b then extends from the first part 30a, and comprises the three quantum wells 32, each having a substantially identical local diameter.

Each quantum well 32 is covered at the level of its lateral edge 33 with a passivating layer 34, here of GaN, or even of AlN or AlGaN. This passivating layer 34 has a thickness greater than or equal to 2 nm and advantageously between 2 nm and 15 nm. In this example, the passivating layer 34 comprises a first lateral part 34a, in contact with the lateral edge 33 of the quantum wells, obtained simultaneously with formation of the quantum wells. It advantageously comprises a second lateral part 34b, which covers the first passivating part 34a and forms the side wall 35 of the active portion. This second passivating part 34b is formed separately in the step of formation of the quantum wells. This second passivating part 34b thus forms the side wall 35 of the active portion and may cover the lateral edge of the first doped portion 10.

Epitaxial formation of the first part 30a of the active portion 30 may be obtained by lowering the temperature of growth to a value $T_2$ below the value $T_1$ of growth of the first doped portion, for example between 600° C. and 800° C., for example 670° C. Moreover, the nominal III/V ratio, here the ratio Ga/N, has a value (III/V)$_2$ greater than the value (III/V)$_1$ of growth of the first doped portion. The first part 30a of the active portion 30, of GaN, is thus formed, the local maximum diameter of which depends on the values of the temperature and the nominal III/V ratio. The active portion then has a substantially constant local diameter.

Epitaxial formation of the layers 32 forming the quantum wells is obtained by introducing a flux of indium according to a value of the nominal In/III ratio between 5% and 70%, and preferably between 10% and 50%, as a function of the required optical properties of emission of the wire. Thus, an alternation of layers is formed, forming the quantum wells of InGaN and barrier layers of GaN. Concomitantly with formation of the quantum wells, a passivating layer 34, here of GaN, is formed at the lateral edge 33 of the quantum wells 32.

An optional step of formation of a second lateral part 34b of passivating layer 34 may then be performed, in the course of which the flux of indium is stopped. The temperature of growth may be substantially equal to or even greater than the value corresponding to growth of the active portion. The value of the nominal III/N ratio is for example substantially equal to 1.5. The second lateral part of the passivating layer covers the first part of the passivating layer and may also cover the lateral edge of the first n-doped portion.

The second doped portion 20, provided with an electron blocking layer, is then formed, employing the operating conditions described above.

Similarly to the embodiment described with reference to FIG. 5, the optoelectronic device may comprise a plurality of three-dimensional semiconductor structures 2 in mutual contact at the level of the active portions 30. The quantum wells 32 of one and the same active portion 30 are then separated from the quantum wells 32 of the adjacent active portion by the first lateral part 34a of the passivating layer 34.

Figure 6B:
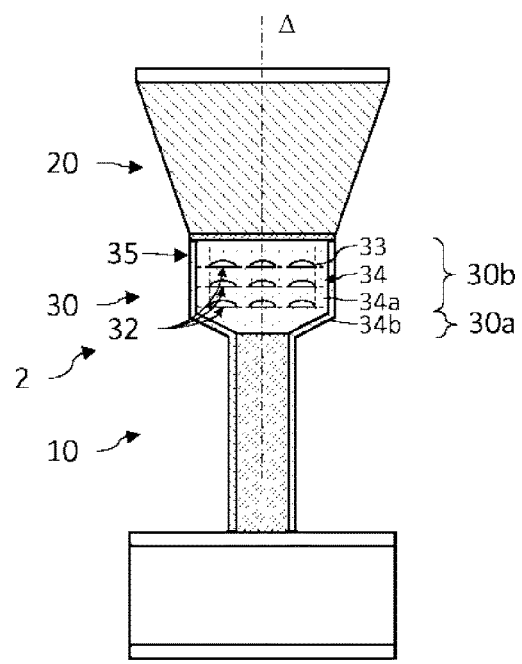
FIG. 6b is a schematic sectional view of another variant of three-dimensional semiconductor structure in an axial configuration, whose active portion comprises multiple quantum wells in the form of quantum dots.

FIG. 6b is a schematic partial view of a section of another three-dimensional semiconductor structure of an optoelectronic device in an axial wire configuration. The three-dimensional semiconductor structure is similar to that described with reference to FIG. 6a and differs from it essentially in that the active portion 30 comprises multiple quantum wells 32 in the form of quantum dots inserted along the longitudinal axis between barrier layers.

A three-dimensional semiconductor structure of this kind may be obtained by the method described above with reference to the variant in FIG. 6a, and differs from it essentially in that the In/III ratio has a value above a threshold value, said value being substantially equal to 20% in the case of quantum wells of InGaN resting on a barrier layer of GaN.

Similarly to the embodiment described with reference to FIG. 5, the optoelectronic device may comprise a plurality of three-dimensional semiconductor structures in mutual contact at the level of the active portions. The quantum dots of one and the same active portion are then separated from the quantum dots of the adjacent active portion by the first lateral part of the passivating layer.

Particular embodiments have just been described. Variant embodiments and modifications will be apparent to a person skilled in the art.

Three-dimensional semiconductor structures suitable for emitting light starting from an electrical signal, thus forming light-emitting diodes, have been described. Alternatively, the structures may be adapted to detect incident light and produce an electrical signal in response, thus forming a photodiode. The applications may relate to the field of optoelectronics or photovoltaics.

The invention claimed is:

1. An optoelectronic device comprising:
   at least one three-dimensional semiconductor structure extending along a longitudinal axis substantially orthogonal to a plane of a substrate on which it lies, and comprising:
   a first doped portion, extending from a face of the substrate along the longitudinal axis;
   an active portion comprising at least one quantum well, extending from the first doped portion along the longitudinal axis;
   a second doped portion, extending from the active portion along the longitudinal axis;
   wherein
   the quantum well of the active portion has an average diameter greater than that of the first doped portion, and is covered laterally by a passivating layer; and
   further comprising a plurality of three-dimensional semiconductor structures extending substantially parallel to one another, whose active portions are in mutual contact, wherein the quantum well or wells of each active portion are separated from the quantum well or wells of an adjacent active portion by the passivating layers in mutual contact.

2. The optoelectronic device as claimed in claim 1, having a density of first doped portions per unit area of the substrate between $0.5 \times 10^{10}$ cm$^{-2}$ and $1.5 \times 10^{10}$ cm$^{-2}$, the first doped portions being separate from one another and having an average diameter that is substantially constant along the longitudinal axis.

3. The optoelectronic device as claimed in claim 1, the passivating layer having an average thickness greater than or equal to 2 nm.

4. The optoelectronic device as claimed in claim 1, the first doped portion being made of a III-V compound, a II-VI compound, or a IV element or compound, the passivating layer being made of a compound comprising at least one element present in the compound of the first doped portion.

5. The optoelectronic device as claimed in claim 1, the average diameter of the quantum well or wells being between 115% and 250% of the average diameter of the first doped portion.

6. The optoelectronic device as claimed in claim 1, the active portion comprising a single quantum well extending continuously between the first and second doped portions, and the single quantum well being covered laterally by the passivating layer.

7. The optoelectronic device as claimed in claim 1, wherein the active portion comprises plural layers forming quantum wells or quantum dots inserted between barrier layers, covered laterally by the passivating layer.

8. The optoelectronic device as claimed in claim 1, the three-dimensional semiconductor structure being made of a material comprising predominantly a III-N compound, the passivating layer being made of a compound selected from GaN, AlGaN and AlN.

9. A method for making an optoelectronic device as claimed in claim 1, wherein the three-dimensional semiconductor structures are formed by molecular beam epitaxy.

10. The method as claimed in claim 9, comprising formation, by epitaxial growth, of a plurality of three-dimensional semiconductor structures in which:
   i) the first doped portions, which extend from a face of the substrate along the longitudinal axis, are formed;
   ii) the active portions comprising at least one quantum well, which extend from the first doped portions along the longitudinal axis, are formed;
   wherein:
   in ii), the quantum well of each active portion is formed to have an average diameter greater than that of the first doped portion;
   in addition, a passivating layer is formed, covering the quantum well laterally.

11. The method as claimed in claim 10, wherein formation of the passivating layer is concomitant with formation of the quantum well.

12. The method as claimed in claim 9, the three-dimensional semiconductor structure predominantly comprising a III-V compound, wherein ii) formation of the active portion is carried out at a value of temperature of epitaxial growth below a value in i) of formation of the first doped portion, and between 600° C. and 680° C., and is performed at a ratio of the atomic flux of the III elements to the V elements between 0.33 and 0.60.

13. The method as claimed in claim 12, wherein i) formation of the first doped portion comprises nucleation of the III-V compound performed at a temperature of growth such that a density of first doped portions per unit area of the substrate is between $0.5 \times 10^{10}$ cm$^{-2}$ and $1.5 \times 10^{10}$ cm$^{-2}$.

* * * * *